United States Patent
Kamata et al.

(10) Patent No.: US 11,476,088 B2
(45) Date of Patent: Oct. 18, 2022

(54) ARRAY ANTENNA AND PLASMA PROCESSING APPARATUS

(71) Applicant: Tokyo Electron Limited, Tokyo (JP)

(72) Inventors: Eiki Kamata, Nirasaki (JP); Taro Ikeda, Nirasaki (JP); Mikio Sato, Nirasaki (JP); Nobuhiko Yamamoto, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 17/144,647

(22) Filed: Jan. 8, 2021

(65) Prior Publication Data
US 2021/0225612 A1    Jul. 22, 2021

(30) Foreign Application Priority Data
Jan. 16, 2020   (JP) .............................. JP2020-004973

(51) Int. Cl.
*H01J 37/32*   (2006.01)
*H05H 1/46*   (2006.01)
*H01Q 1/52*   (2006.01)

(52) U.S. Cl.
CPC ..... *H01J 37/3211* (2013.01); *H01J 37/32266* (2013.01); *H01Q 1/52* (2013.01); *H05H 1/46* (2013.01); *H05H 1/463* (2021.05)

(58) Field of Classification Search
CPC ....... H01J 35/32266; H05H 1/46; H01Q 1/52; H01Q 1/521; H01Q 1/523; G01R 29/105
See application file for complete search history.

(56) References Cited

U.S. PATENT DOCUMENTS

| | | | | |
|---|---|---|---|---|
| 5,556,501 | A * | 9/1996 | Collins | H01J 37/3222 257/E21.252 |
| 6,441,552 | B1* | 8/2002 | Brandenburg | H01J 61/54 315/111.21 |
| 8,028,655 | B2* | 10/2011 | Brcka | H01J 37/321 118/723 AN |
| 10,090,134 | B2* | 10/2018 | Godyak | H01J 37/32183 |
| 10,938,108 | B2* | 3/2021 | Henry | H01Q 3/22 |
| 2004/0262645 | A1* | 12/2004 | Huff | H01P 1/127 257/232 |
| 2005/0062653 | A1* | 3/2005 | Cetiner | H01Q 1/38 343/700 MS |
| 2005/0136604 | A1* | 6/2005 | Al-Bayati | H01L 29/7843 438/301 |

(Continued)

FOREIGN PATENT DOCUMENTS

| | | |
|---|---|---|
| JP | 2005-285564 A | 10/2005 |
| JP | 2013-143448 A | 7/2013 |
| JP | 2017-103454 A | 6/2017 |

*Primary Examiner* — Abdullah A Riyami
*Assistant Examiner* — Syed M Kaiser
(74) *Attorney, Agent, or Firm* — Nath, Goldberg & Meyer; Jerald L. Meyer; Tanya E. Harkins

(57) ABSTRACT

An array antenna radiates an electromagnetic wave into a chamber of a plasma processing apparatus. The array antenna includes antennas and coupling prevention elements arranged at intervals between the antennas. Each of the coupling prevention elements includes a first member connected to a ceiling wall which is a ground surface in the chamber and a second member connected to a tip end of the first member or a vicinity of the tip end of the first member.

9 Claims, 10 Drawing Sheets

(56) References Cited

U.S. PATENT DOCUMENTS

| | | | |
|---|---|---|---|
| 2008/0050537 A1* | 2/2008 | Godyak | H01J 37/321 427/575 |
| 2008/0136710 A1* | 6/2008 | Nefedov | H01Q 1/2283 343/700 MS |
| 2012/0007503 A1* | 1/2012 | Kim | H05H 1/46 315/34 |
| 2017/0133202 A1* | 5/2017 | Berry, III | H01J 37/3244 |

* cited by examiner

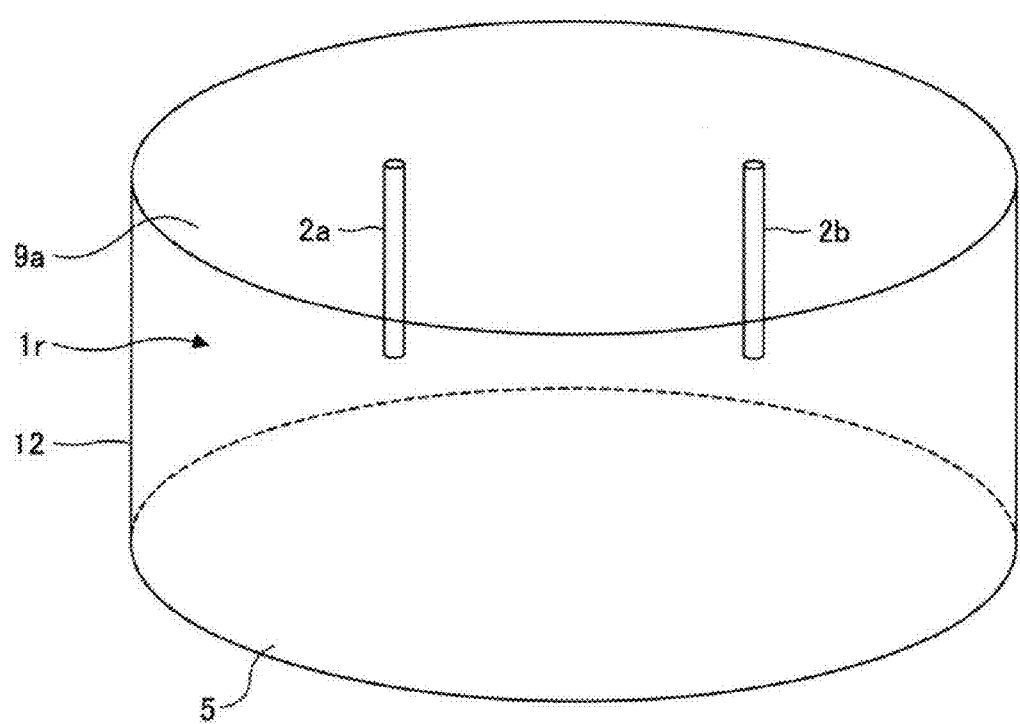

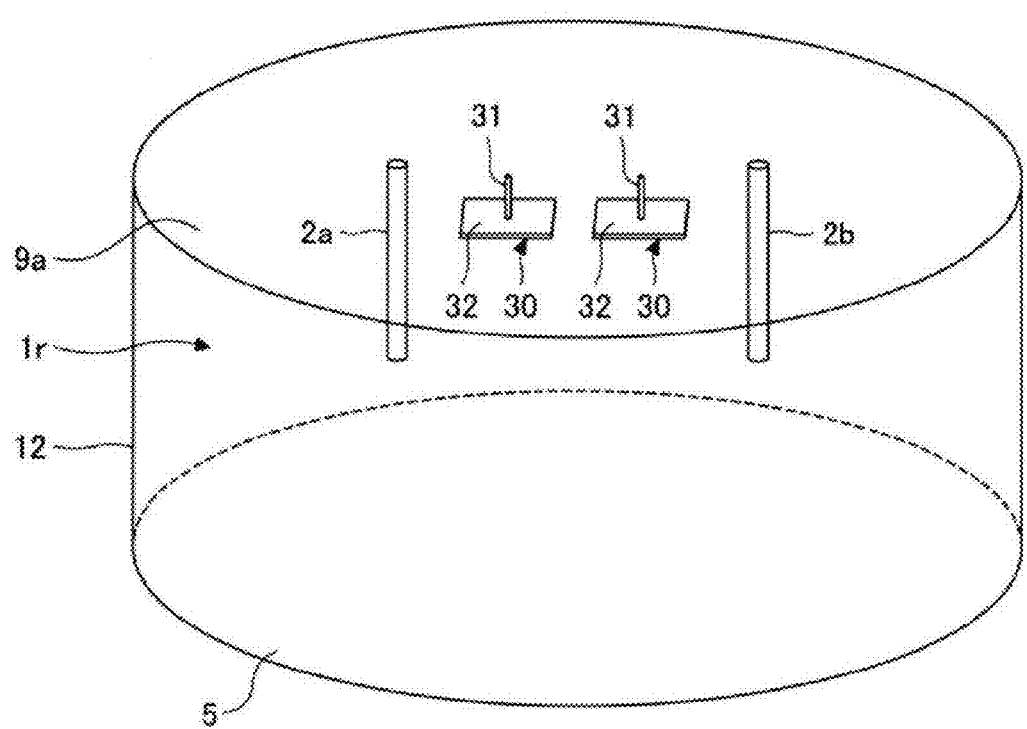

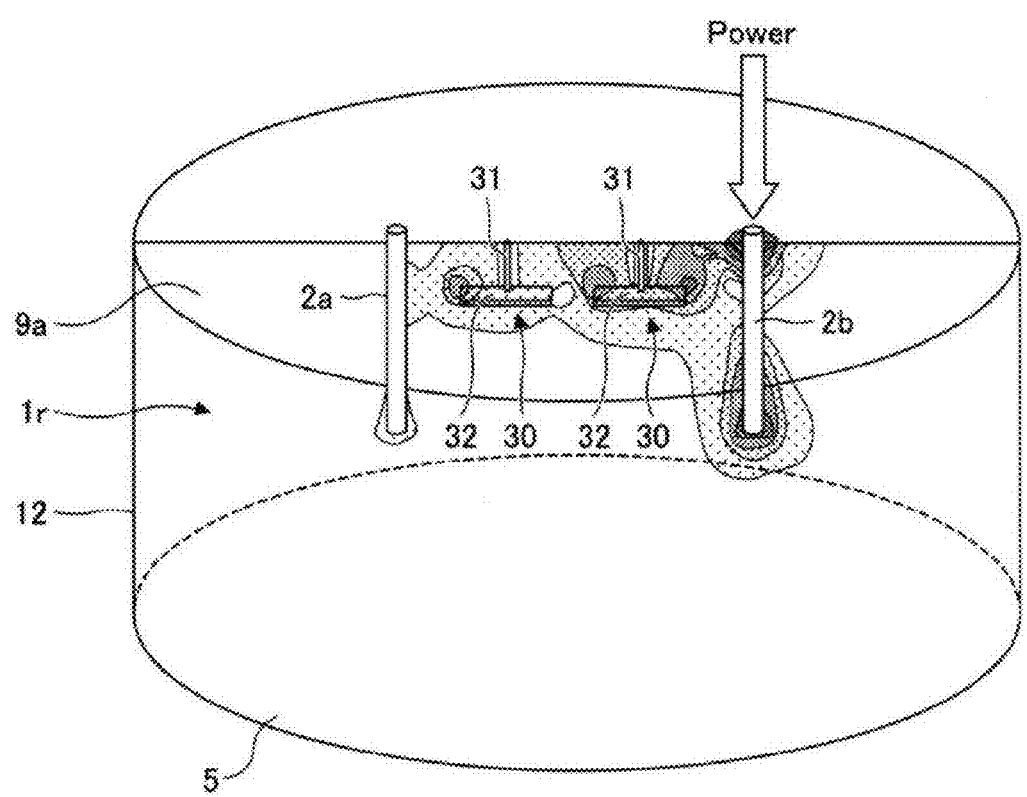

ARRAY ANTENNA AND PLASMA PROCESSING APPARATUS

CROSS-REFERENCE TO RELATED APPLICATION

This application is based upon and claims the benefit of priority from Japanese Patent Application No. 2020-004973, filed on Jan. 16, 2020, the entire contents of which are incorporated herein by reference.

TECHNICAL FIELD

The present disclosure relates to an array antenna and a plasma processing apparatus.

BACKGROUND

A plasma processing apparatus that turns a gas into plasma powered by an electromagnetic wave and performs plasma processing on a wafer is known. For example, Patent Document 1 proposes a method of modifying a reaction rate on a semiconductor substrate in a chamber by using a microwave antenna of a phased array, in which plasma is excited in the chamber and a microwave radiation beam is radiated from the microwave antenna of the phased array to direct the beam into plasma so as to change the reaction rate on the surface of the semiconductor substrate in the chamber.

PRIOR ART DOCUMENTS

Patent Document

Japanese Laid-Open Publication No. 2017-103454

SUMMARY

According to one embodiment of the present disclosure, there is provided an array antenna that radiates an electromagnetic wave into a chamber of a plasma processing apparatus, including: antennas; and coupling prevention elements arranged at intervals between the antennas, wherein each of the coupling prevention elements includes: a first member connected to a ceiling wall which is a ground surface in the chamber; and a second member connected to a tip end of the first member or a vicinity of the tip end of the first member.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 4A and 4B are views for explaining electromagnetic coupling between antennas in the related art.

FIGS. 5A and 5B are views showing electromagnetic coupling suppression between antennas by a coupling prevention element according to an embodiment.

DETAILED DESCRIPTION

Figure 1:
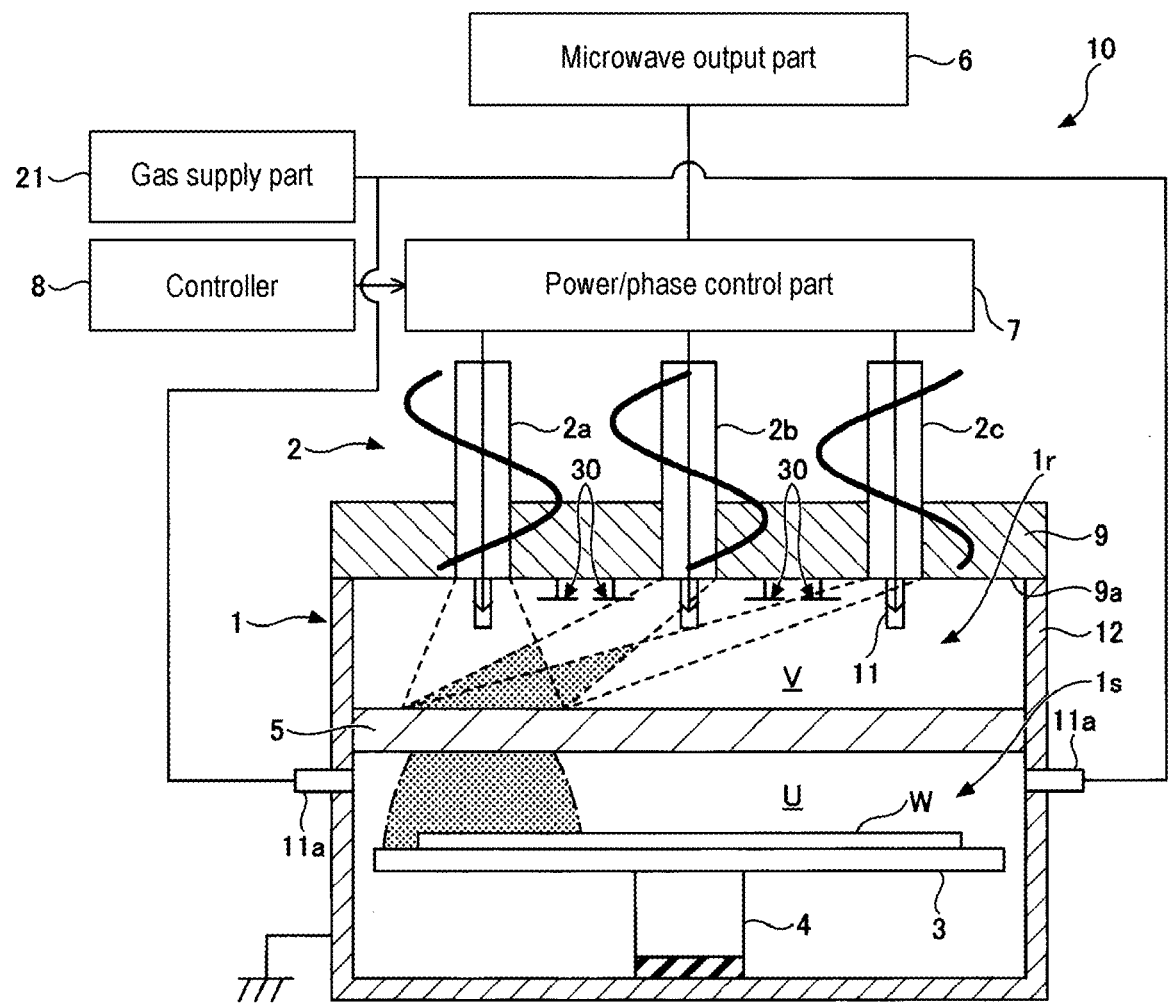
FIG. 1 is a schematic sectional view showing an example of a plasma processing apparatus according to an embodiment.

Reference will now be made in detail to various embodiments, examples of which are illustrated in the accompanying drawings. Throughout the drawing, the same components may be denoted by the same reference numerals and explanation thereof may not be repeated. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Plasma Processing Apparatus

A plasma processing apparatus 10 according to an embodiment will be described with reference to FIG. 1. FIG. 1 is a schematic sectional view showing an example of the plasma processing apparatus 10 according to the embodiment. The plasma processing apparatus 10 will be described using a microwave plasma processing apparatus as an example.

The plasma processing apparatus 10 according to an embodiment has a chamber 1 in which a substrate W such as a wafer or the like is accommodated. The interior of the chamber 1 includes a processing chamber 1s in which a gas is turned into plasma using surface wave plasma that is powered using a microwave. Predetermined plasma processes such as a film forming process and an etching process are performed on the substrate W, and a closed space 1r is partitioned from the processing chamber 1s by a dielectric window 5.

The chamber 1 has substantially a hollow cylinder shape and is grounded. An upper opening of the chamber 1 is closed by a ceiling wall 9, which makes it possible to keep the interior of the chamber 1 airtight. The chamber 1 is made of a metal material such as aluminum and stainless steel and is grounded. With such a configuration, the ceiling wall 9 and a sidewall 12 of the chamber 1 are connected to the ground.

A stage 3 on which the substrate W is placed is supported by a cylindrical support member 4 extending from the center of the bottom portion in the chamber 1. The stage 3 may be provided with an electrostatic chuck for electrostatically adsorbing the substrate W, a temperature control mechanism, a gas flow path for supplying a heat transfer gas to the surface of the substrate W, and the like. Further, a high frequency bias power supply may be electrically connected to the stage 3 via a matching device. However, the high frequency bias power supply may not be provided depending on the characteristics of plasma processing.

An exhaust pipe (not shown) is connected to the bottom portion of the chamber 1, and an exhaust device including a vacuum pump (not shown) is connected to the exhaust pipe. When the exhaust device is operated, the interior of the chamber 1 is exhausted, whereby the interior of the processing chamber 1s is depressurized to a predetermined degree of vacuum. A loading/unloading port (not shown) for loading/unloading the substrate W and a gate valve (not shown) for opening/closing the loading/unloading port are installed on the sidewall of the chamber 1.

Gas pipes 11a are formed in the chamber 1, and a gas supplied from the gas supply part 21 is supplied to the processing chamber 1s via the gas pipes 11a.

An array antenna 2 composed of seven monopole antennas 2a to 2g (only monopole antennas 2a to 2c are shown in FIG. 1) that radiate microwaves into the chamber 1 (see FIG. 3) is installed in the ceiling wall 9. The array antenna 2 irradiates the interior of the chamber 1 with electromagnetic waves from the monopole antennas. The number of monopole antennas is not limited to seven, but may be two or more, preferably three or more. The monopole antennas correspond to antennas included in the array antenna 2.

Figure 2:
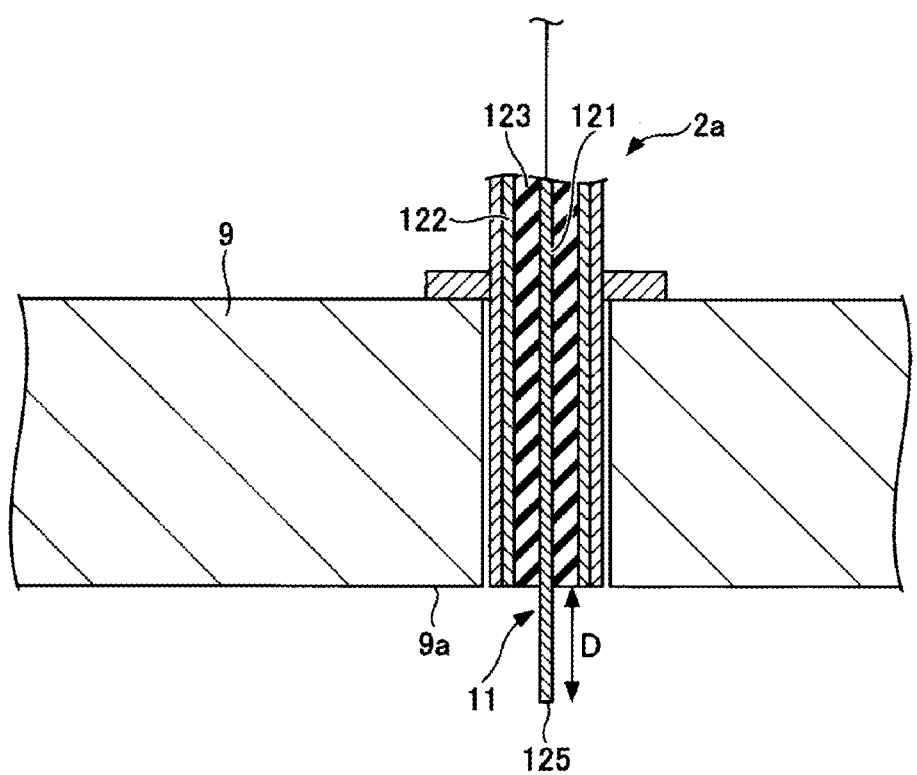
FIG. 2 is a view showing an example of a monopole antenna according to an embodiment.

The monopole antennas 2a to 2g have the same configuration. FIG. 2 shows a representative configuration of the monopole antenna 2a, and the illustration and description of the configurations of the other monopole antennas 2b to 2g will be omitted. The monopole antenna 2a is formed in a coaxial cable shape and has an inner conductor 121, an outer conductor 122 on the outer side thereof, and a dielectric 123 such as Teflon® interposed between them. An air layer may be provided instead of the dielectric 123. A tip end of the monopole antenna 2a constitutes an antenna portion 11 composed of the inner conductor 121 protruding by a length D. The length D of the antenna portion 11 is, for example, several tens of mm to several hundreds of mm.

By exposing the antenna portion 11 to the internal space of the chamber 1 from the end portion of the dielectric 123, which is on a surface having the same height as a lower surface 9a of the ceiling wall 9, a microwave is radiated from a radiating portion 125 into the chamber 1. However, the inner conductor 121 may be configured so as not to protrude from the dielectric 123. The lower surface 9a of the ceiling wall 9 is an electrically grounded surface.

With such a configuration, as shown in FIG. 1, a microwave is output from a microwave output part 6, is controlled in power and/or phase by a power/phase control part 7 under control of a controller 8, and is radiated into the chamber 1.

The monopole antennas 2a to 2g are installed on the ceiling wall 9 at approximately equal intervals. A distance between the centers of adjacent monopole antennas 2a to 2g is set so as to be smaller than $\lambda/2$ with respect to the wavelength $\lambda$ of the microwave. The dielectric window 5 is a partition plate that partitions the chamber 1 between antenna portions 11 and the stage 3 to divide the chamber 1 into a space V above the dielectric window 5 and a space U below the dielectric window 5. The dielectric window 5 is made of, for example, quartz, ceramics such as alumina ($Al_2O_3$) or the like, fluorine-based resin such as polytetrafluoroethylene or the like, or polyimide-based resin. The space V above the dielectric window 5 is the closed space 1r in which the monopole antennas 2a to 2g and coupling prevention elements 30 are arranged, and is a space that radiates a microwave electromagnetic wave. The space U below the dielectric window 5 is the processing chamber 1s and is a space in which a gas is turned into plasma by a microwave electromagnetic wave and a desired process is performed on the substrate W by the plasma.

In the closed space 1r, there is a free space of about several tens of mm to several hundreds of mm, and plasma is generated in the processing chamber 1s through the dielectric window 5 installed below the free space. A distance between the tip ends of the antenna portions 11 and the upper surface of the dielectric window 5 is larger than $\lambda/4$ with respect to the wavelength $\lambda$ of the microwave. The microwaves output from the monopole antennas 2a to 2g are radiated into the closed space 1r and propagate in the closed space 1r. The closed space 1r is an atmospheric space, and the processing chamber 1s is a vacuum space.

The plasma processing apparatus 10 has the controller 8. The controller 8 is a computer including a processor, a storage part such as a memory, an input part, a display part, a signal input/output interface part, and the like, and controls each part of the plasma processing apparatus 10. A control program and recipe data are stored in the storage part. The computer (CPU) executes the control program to controls each part of the plasma processing apparatus 10 according to the recipe data. Further, the computer controls the power/phase control part 7 provided for each antenna portion 11 of the array antenna 2 and controls the power and/or phase of the microwave radiated from the antenna portion 11. The storage part may be a non-transitory computer-readable storage medium.

When performing plasma processing in the plasma processing apparatus 10 having such a configuration, first, while being held on a transfer arm, the substrate W is loaded into the chamber 1 from the opened gate valve through the loading/unloading port.

When the substrate W is transferred above the stage 3, it is moved from the transfer arm to pusher pins and is placed on the stage 3 by lowering the pusher pins. The gate valve is closed after the substrate W is loaded in. An internal pressure of the processing chamber 1s is maintained at a predetermined degree of vacuum by the exhaust device. A predetermined gas is introduced into the processing chamber 1s under the dielectric window 5. A microwave whose power and/or phase is controlled strengthens an electric field at a predetermined position of the dielectric window 5, so that the gas in the processing chamber 1s is turned into plasma to generate local plasma. By scanning the local plasma, a spatial distribution of the time integral value of the plasma density can be controlled, so that the substrate W is subjected to uniform or desired plasma processing.

The plasma processing apparatus 10 according to one embodiment controls the power and phase of the microwave radiated from each of the monopole antennas 2a to 2g by using the power/phase control part 7 under control of the controller 8. Thereby, the microwave input from each of the monopole antennas 2a to 2g causes interference to increase the electric field strength at an arbitrary position. This makes it possible to control the plasma density distribution at a high level by intensively generating the plasma.

Since the microwave synthesis by phase control described above does not involve mechanical operation, high speed control is possible. As a result, the power/phase control of the monopole antennas 2a to 2g can be controlled at a high speed. That is, it is possible to move the focal position C of the microwave synthesis over the time with high speed control up to the same level as the microwave frequency. As a result, the plasma density distribution can be controlled uniformly or freely.

Figure 3:
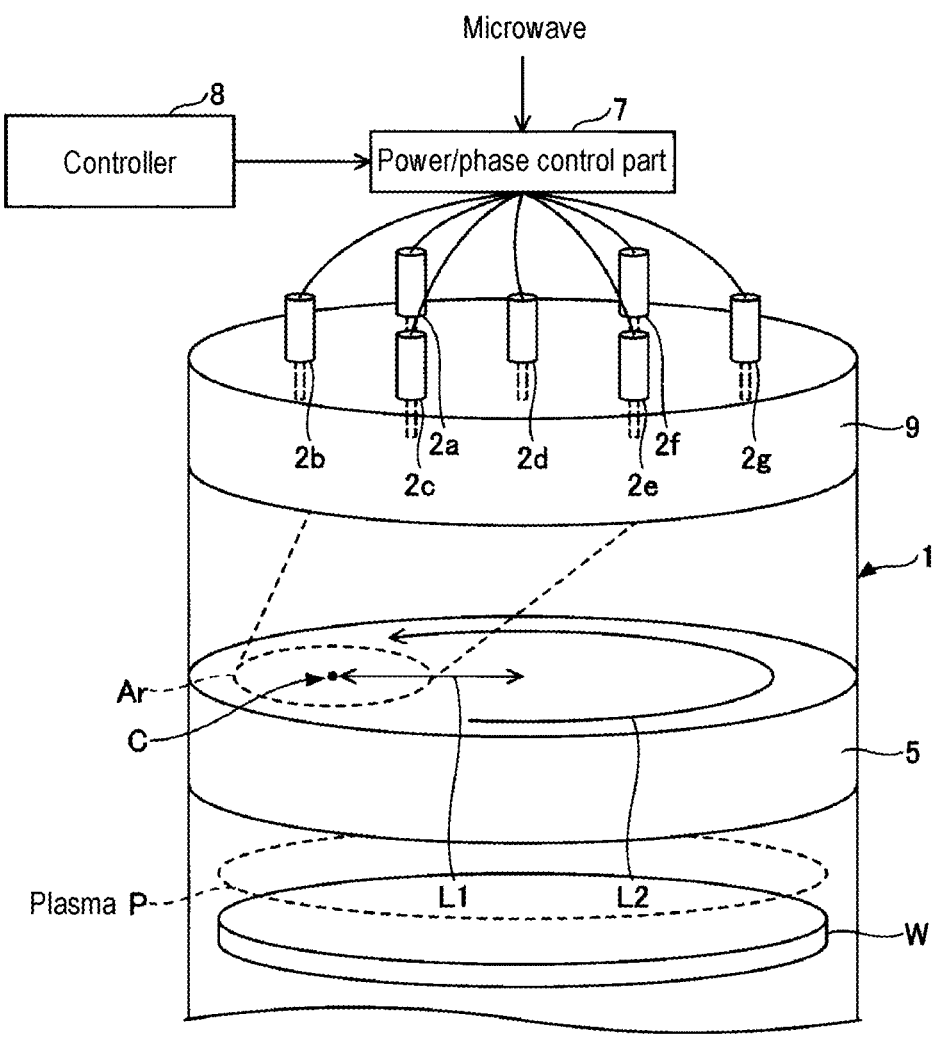
FIG. 3 is a view showing an example of power/phase control according to an embodiment.

FIG. 3 is a view showing an example of the power/phase control by the controller 8 according to the embodiment. In the example of FIG. 3, the controller 8 uses the power/phase control part 7 to control the phases $\varphi(xa)$ to $\varphi(xg)$ of the microwaves radiated from the monopole antennas 2a to 2g to be reinforced each other at the focal position C. Further, the electric power of the microwave radiated from each of the monopole antennas 2a to 2g is controlled in order to control the strength of the electric field of the microwave in a composite portion Ar centered on the focal position C.

The controller 8 uses the power/phase control part 7 to control the microwave phases φ(xa) to φ(xg) at a high speed so that the focal position C scans the surface of the dielectric window 5 in the radial direction L1, the circumferential direction L2, or the like. Further, during scanning, the controller 8 controls the microwave power using the power/phase control part 7. By controlling the microwave power while moving the focal position C and the composite portion Ar at a high speed in this way, the density distribution of plasma P generated by the power of a microwave transmitted below the dielectric window 5 can be controlled freely.

Further, the controller 8 can change a moving speed of the composite portion Ar by changing the speed of controlling the microwave phases φ(xa) to φ(xg) using the power/phase control part 7. For example, the controller 8 changes a scanning speed by controlling the microwave phase φ(xa) to φ(xg) so that the composite portion Ar on the outer peripheral side of the dielectric window 5 is moves slower and the composite portion Ar on the inner peripheral side is moves faster than the outer peripheral side. The controller 8 also controls the microwave power during scanning. As a result, the plasma density distribution can be freely controlled, such as controlling the plasma density on the outer periphery in the processing chamber 1s to be higher than the plasma density on the inner periphery.

Coupling Prevention Element

Figure 4B:
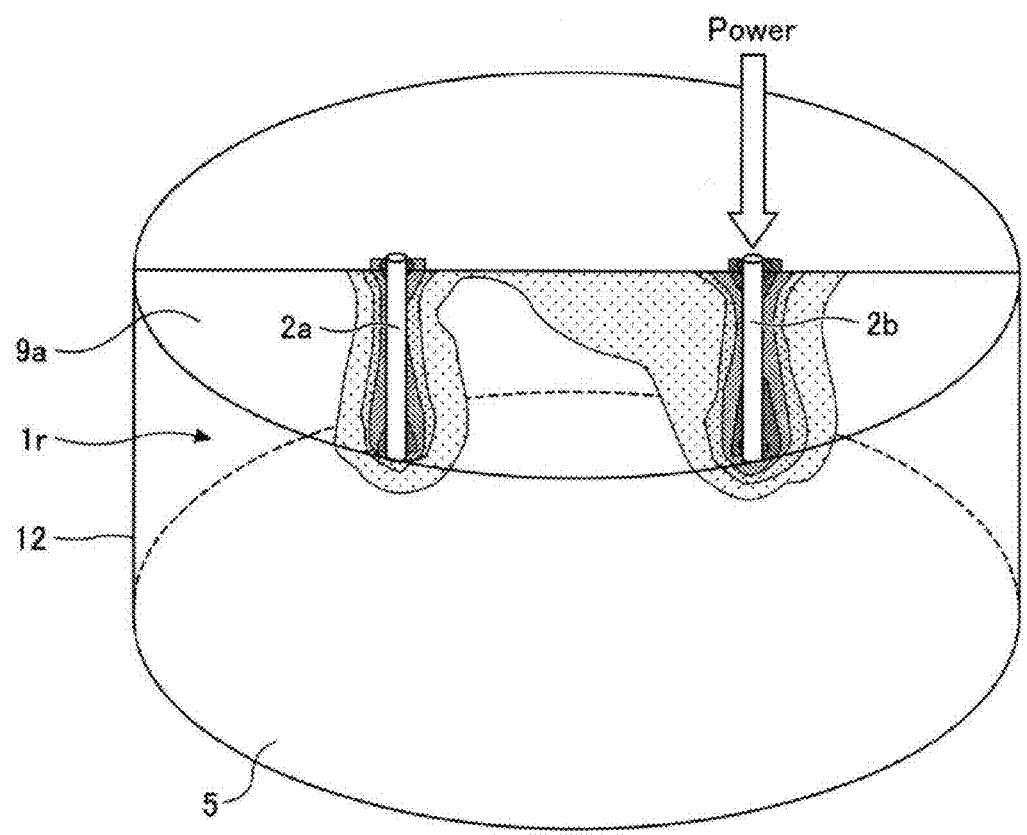

As shown in FIG. 1, two coupling prevention elements 30 are interposed between adjacent monopole antennas. Each coupling prevention element 30 is configured to suppress electromagnetic coupling between monopole antennas. Hereinafter, the electromagnetic coupling between monopole antennas in the related art when the coupling prevention element 30 is not disposed will be described with reference to FIGS. 4A and 4B. After that, the electromagnetic coupling suppressing function of the coupling preventing element 30 according to the embodiment will be described with reference to FIGS. 5A and 5B. FIGS. 4A and 4B are views for explaining electromagnetic coupling between antennas in the related art. FIGS. 5A and 5B are views for explaining electromagnetic coupling suppression between antennas by the coupling prevention element 30 according to the embodiment. For convenience of explanation, the monopole antennas 2a and 2b will be described as an example, but in the embodiment, two coupling prevention elements 30 are interposed between the adjacent monopole antennas.

In the related art, a phenomenon where an electromagnetic microwave under the monopole antennas 2a and 2b is weakened may have occurred due to electromagnetic coupling between the monopole antennas 2a and 2b and electromagnetic coupling between the monopole antennas 2a and 2b and mainly the sidewall 12.

As shown in FIGS. 4A and 4B, the electromagnetic microwave is supplied from the monopole antennas 2a and 2b to the closed space 1r above the dielectric window 5 in the chamber 1. In simulation, a microwave is not supplied from the monopole antenna 2a and is output only from the monopole antenna 2b. That is, in this simulation, as shown in FIG. 4B, the power of the microwave is radiated from only the monopole antenna 2b into the closed space 1r and is not radiated from the monopole antenna 2a.

In this simulation, due to the electromagnetic coupling between the monopole antenna 2b and the monopole antenna 2a, a phenomenon occurs where 36% of the microwave power input from the monopole antenna 2b is coupled to the monopole antenna 2a. That is, about ⅓ of the microwave power input to the monopole antenna 2b does not contribute to generation of plasma, which results in power loss.

Therefore, in the embodiment to be described below, at least two coupling prevention elements 30 that function as a meta-material in terms of a circuit constant are interposed between the monopole antenna 2b and the monopole antenna 2a.

As shown in FIGS. 5A and 5B, in an example of the array antenna 2 according to an embodiment, two coupling prevention elements 30 are installed between the monopole antenna 2b and the monopole antenna 2a. The two coupling prevention elements 30 are installed at intervals between the monopole antennas. The two coupling prevention elements 30 are of a mushroom type and have the same configuration having a body portion and an umbrella portion.

The body portion of each coupling prevention element 30 is a first member 31 connected to the ceiling wall 9 having the lower surface 9a being the ground surface in the chamber 1. The umbrella portion is a second member 32 connected to the tip end or the vicinity of the tip end of the first member 31. The first member 31 and the second member 32 may be made of metal (conductor) of the same material, or may be made of metal of a different material.

Further, the number of coupling prevention elements is not limited to two, and two or more coupling prevention elements may be disposed on a line connecting the monopole antennas. The maximum performance of the coupling prevention element 30 as a meta-material increases as the number of coupling prevention elements 30 interposed between the antennas increases, but it becomes difficult to adjust between the coupling prevention elements 30.

In the embodiment, the first member 31 has a rod shape, the second member 32 has a quadrangular plate shape, and the tip end of the first member 31 is fitted in the center of the second member 32. However, the shape is not limited thereto. For example, the first member 31 and the second member 32 are both rod-shaped, and the tip end of the first member 31 may be fitted in the center of the second member 32 so as to form a T shape.

In this simulation, as shown in FIG. 5B, the microwave power is radiated into the closed space 1r from only the monopole antenna 2b, not from the monopole antenna 2a. In the example of FIG. 5B, the electromagnetic coupling between the monopole antenna 2b and the monopole antenna 2a is suppressed by the function of the coupling prevention element 30 as a meta-material. As a result, of the microwave power input from the monopole antenna 2b, the coupling to the monopole antenna 2a is only 0.6%. That is, the electromagnetic coupling between the antennas is reduced, and most of the microwave power input to the monopole antenna 2b is used for plasma generation with almost no power loss.

Meta-Material Function of Coupling Prevention Element

Figure 6A:
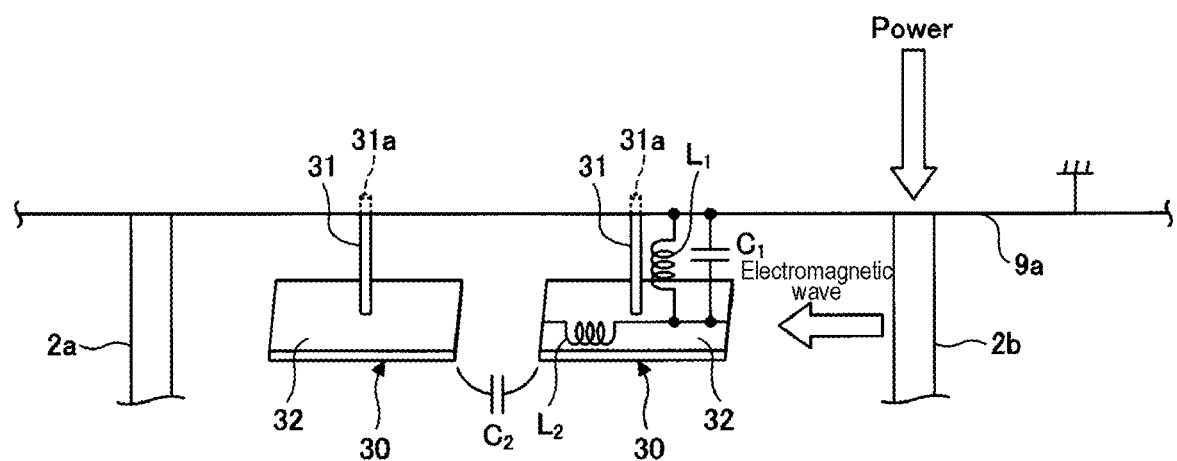
FIGS. 6A and 6B are views showing an example of the configuration of the coupling prevention element according to the embodiment.
Figure 6B:
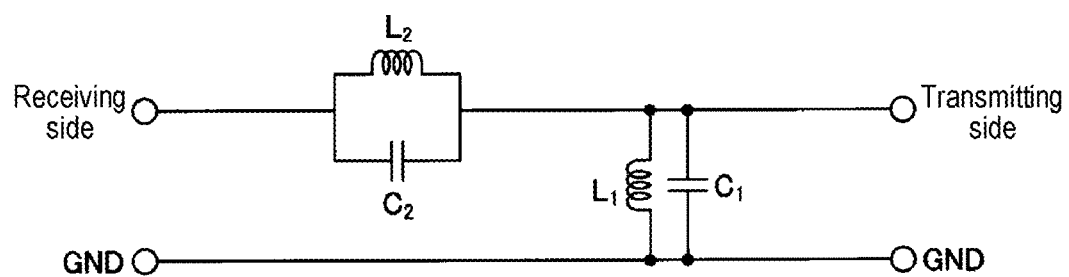

Next, the operation of the coupling prevention element 30 and the function of the meta-material will be described in more detail with reference to FIGS. 6A and 6B. FIG. 6A is a view showing an example of the configuration and arrangement of the coupling prevention element 30 connected to the lower surface 9a of the ceiling wall 9 according to the embodiment. FIG. 6B is an equivalent circuit of FIG. 6A.

The equivalent circuit shown in FIG. 6B has an inductance component $L_1$ and a capacitance component $C_1$ of the first member 31 connected in series between a signal line on the transmitting side (the monopole antenna 2b) and the ground. It also has an inductance component $L_2$ of the second member 32 connected in parallel to these components $L_1$ and $C_1$ on the signal line and a capacitance component $C_2$ between two coupling prevention elements 30.

The capacitance component $C_1$ and the inductance component $L_1$ are determined by the dimensions of the first member 31. The capacitance component $C_2$ and the inductance component $L_2$ are determined by the dimensions of the second member 32 and the arrangement of (interval between) the two opposing second members 32. By appropriately setting these values, resonance of an electromagnetic microwave input from the monopole antenna 2b is generated. Thereby, a specific electromagnetic wave directing from the monopole antenna 2b to the monopole antenna 2a can be eliminated, and thus the electromagnetic coupling between the antennas can be suppressed. As a result, the two coupling prevention elements 30 can function as a meta-material. The surface area of the second member 32 corresponds to the electrode area of a capacitor.

The capacitance component $C_2$ determined by the arrangement of (interval between) the two second members 32 and the inductance component $L_1$ determined by the length of the first member 31 are essential components for generating the resonance of the electromagnetic microwave wave. That is, the coupling prevention element 30 can function as a meta-material by generating the capacitance component $C_2$ and the inductance component $L_1$ depending on the number and arrangement of coupling prevention elements 30. Therefore, in order to include the capacitance component $C_2$, at least two coupling prevention elements 30 are interposed between adjacent monopole antennas to create a meta-material.

Then, the capacitance component $C_2$ and the inductance component $L_1$ re used to resonate the electromagnetic microwave at a specific frequency according to the dimensions of the coupling prevention element 30. As a result, the electromagnetic microwave input from the monopole antenna 2b is almost totally reflected by the two coupling prevention elements 30 having the function of the meta-material. By adjusting the impedance, the reflected electromagnetic microwave does not return to the microwave output part 6 side, but is radiated from the antenna portion 11 to the closed space 1r, which contributes to the generation of plasma.

The first member 31 is installed in a direction substantially vertical to the lower surface 9a of the ceiling wall 9. The second member 32 is installed in a direction substantially horizontal to the lower surface 9a. However, the first member 31 may be tilted at a predetermined angle from the direction vertical to the lower surface 9a. As a result, the capacitance component $C_1$ can be finely adjusted, so that the resonance frequency can be finely adjusted.

Each coupling prevention element 30 having such a configuration is removable. As an example, a base end 31a of the first member 31 is press-fitted into a hole formed in the ceiling wall 9. The base end 31a of the first member 31 may be inserted into a hole formed in the lower surface 9a and may be fastened by screws. A through-hole may be formed in the ceiling wall 9 and the first member 31 may be penetrated through the through-hole from above and fixed on the upper surface of the ceiling wall 9. The tip of the first member 31 may be press-fitted into a hole formed in the second member 32, or may be fastened by screws to the hole formed in the second member 32.

As a result, each coupling prevention element 30 can be disposed interchangeably. Further, by forming the first member 31 so that it can expand and contract, the length of the first member 31 can be finely adjusted, whereby the inductance component $L_1$ can be finely adjusted so that the resonance frequency can be finely adjusted.

In the example of FIG. 6A, the two coupling prevention elements 30 have symmetry, but the two coupling prevention elements 30 do not necessarily have to be symmetric.

EXAMPLE

Figure 7:
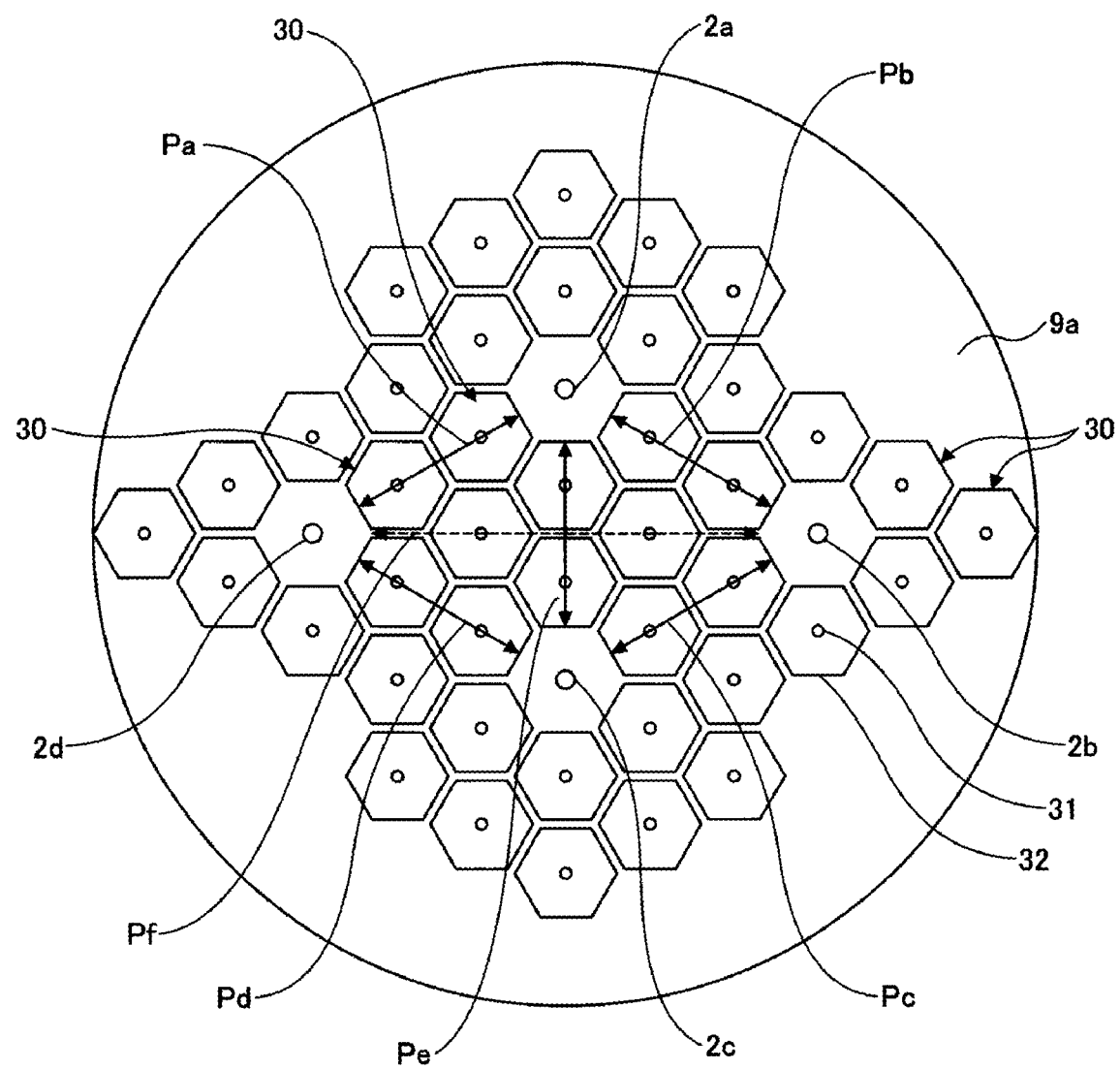
FIG. 7 is a view showing an example of arrangement of coupling prevention elements according to the embodiment.
Figure 8A:
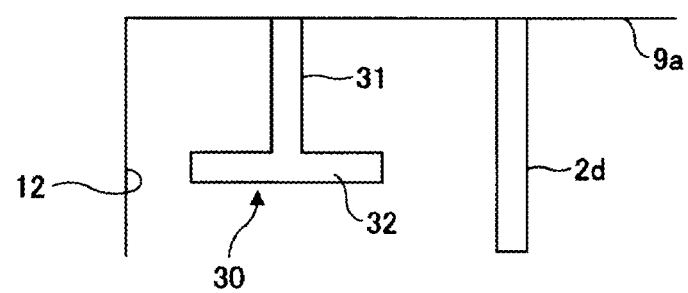
FIGS. 8A and 8B are views showing an example of arrangement of coupling prevention elements according to the embodiment.
Figure 8B:
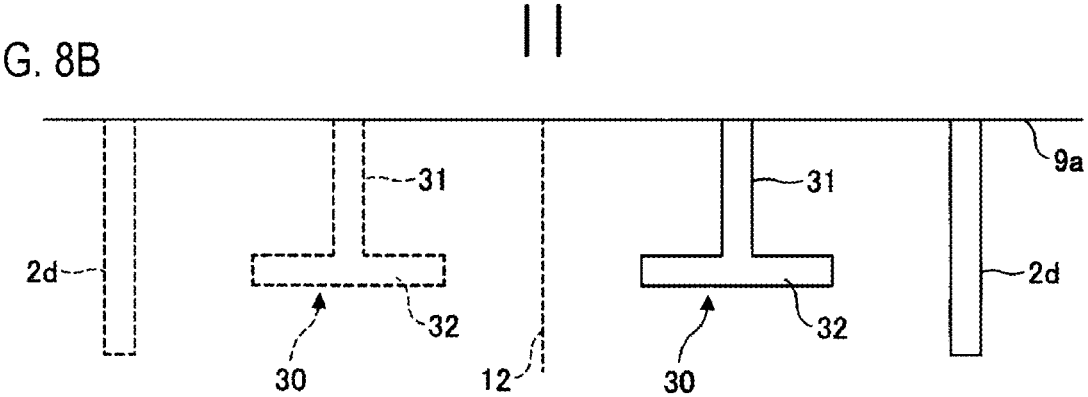

Next, an example of the arrangement of the coupling prevention element 30 according to the embodiment will be described with reference to FIG. 7. FIGS. 7, 8A and 8B are views showing an example of the arrangement of the coupling prevention element 30 according to the embodiment. FIG. 7 is a top view of the plasma processing apparatus 10 and a view of monopole antennas and coupling prevention elements 30 from above. FIG. 7 shows an example in which four monopole antennas 2a to 2d are arranged for convenience of explanation.

In the example of FIG. 7, the second member 32 of the coupling prevention element 30 has a hexagonal shape, and coupling prevention elements 30 are arranged with their adjacent sides of the hexagon facing each other. However, the shape of the second member 32 is not limited thereto, and may be a polygon of a triangle or more. It is preferable that the adjacent sides of the polygon are arranged so as to face each other. By forming the second member 32 in a polygon of a triangle or more, the coupling prevention elements 30 can be arranged two-dimensionally.

Of the four monopole antennas 2a to 2d, two or more coupling prevention elements 30 are interposed between adjacent monopole antennas. For example, two coupling prevention elements 30 are disposed on lines Pa, Pb, Pc, Pd, and Pe connecting adjacent monopole antennas. Thereby, it is possible to cut an electromagnetic wave of a specific frequency directing from one of the adjacent monopole antennas 2a to 2d to the other so that the propagation of the electromagnetic wave to the adjacent monopole antennas 2a to 2d is suppressed. As a result, the two coupling prevention elements 30 interposed between the adjacent monopole antennas 2a to 2d can function as a meta-material.

Further, the electromagnetic wave of a specific frequency from one of the monopole antennas 2b and 2d to the other one of the monopole antennas 2b and 2d can be also cut by the two coupling prevention elements 30 disposed on a line Pf connecting the monopole antennas 2b and 2d, so that the two coupling prevention elements 30 can function as a meta-material in terms of a circuit constant. As described above, by arranging the hexagonal coupling prevention elements 30 two-dimensionally, electromagnetic waves propagating in the vertical, horizontal, and diagonal directions can be suppressed.

Further, as shown in FIGS. 7, 8A and 8B, one or more coupling prevention elements 30 (one in FIGS. 8A and 8B) are interposed between the monopole antennas 2a to 2d and the sidewall 12. As a result, the electromagnetic coupling between the monopole antennas 2a to 2d and the sidewall 12 can be suppressed by the one or more coupling prevention elements 30 interposed between the monopole antennas 2a to 2d and the sidewall 12.

In such a configuration, at least one coupling prevention element 30 may be disposed in order to suppress the electromagnetic coupling between the monopole antennas 2a to 2d and the sidewall 12. The reason for this will be described with reference to FIGS. 8A and 8B. FIGS. 8A and 8B show the monopole antenna 2d, the sidewall 12, and one coupling prevention element 30 interposed between them for convenience of explanation.

The inner surface of the sidewall 12, which serves as the ground surface, is similar to a mirror in terms of an electromagnetic wave, and the electromagnetic wave is reflected by the sidewall 12. That is, for the electromagnetic wave, the configuration shown in FIG. 8A is the same as the configuration shown in FIG. 8B, and therefore, the electromagnetic wave is almost totally reflected by the sidewall 12. Therefore, at least one coupling prevention element 30 may be interposed between the monopole antenna 2d and the sidewall 12, thereby generating the capacitance component $C_2$ corresponding to a distance between the coupling prevention element 30 and the sidewall 12. Therefore, the capacitance component $C_2$ and the inductance component $L_1$ for functioning as a meta-material can be obtained only by interposing one coupling prevention element 30 between the monopole antenna and the sidewall 12. As a result, the electromagnetic coupling between the monopole antennas 2a to 2d and the sidewall 12 can be suppressed.

The monopole antenna may be also disposed on the ceiling wall 9 and/or the sidewall 12. Therefore, the coupling prevention element 30 may be disposed on the ceiling wall 9 and/or the sidewall 12. For example, one or more coupling prevention elements 30 may be interposed between the monopole antennas arranged on the sidewall 12, and the ceiling wall 9.

As described above, according to the array antenna according to the embodiment, it is possible to suppress antenna-to-antenna electromagnetic coupling and antenna-to-wall surface electromagnetic coupling, so that the microwave power can be used to generate plasma more efficiently without a loss.

It is to be considered that the array antenna and the plasma processing apparatus according to the embodiments disclosed this time are examples in all respects and not restrictive. The above embodiments can be modified and improved in various forms without departing from the appended claims and the gist thereof. The matters described in the embodiments can have other configurations unless contradictory, and can be used in combination unless contradictory.

According to the present disclosure in some embodiments, it is possible to suppress electromagnetic coupling between antennas.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An array antenna that radiates an electromagnetic wave into a chamber of a plasma processing apparatus, comprising:
    antennas; and
    coupling prevention elements arranged at intervals between the antennas,
    wherein the antennas and the coupling prevention elements are disposed in a microwave synthesis space above a dielectric window that partitions an interior of the chamber, and
    wherein each of the coupling prevention elements further comprises:
        a first member connected to a ceiling wall which is a ground surface in the chamber; and
        a second member connected to a tip end of the first member or a vicinity of the tip end of the first member.

2. The array antenna of claim 1, wherein the coupling prevention elements are disposed on a line connecting the antennas.

3. The array antenna of claim 2, wherein the coupling prevention elements are interposed between adjacent antennas.

4. The array antenna of claim 3, wherein one or more coupling prevention elements are interposed between a sidewall which is a ground surface in the chamber and an antenna adjacent to the sidewall.

5. The array antenna of claim 4, wherein the second member is a polygon, and adjacent sides of the polygon are arranged so as to face each other.

6. The array antenna of claim 1, wherein the coupling prevention elements are interposed between adjacent antennas.

7. The array antenna of claim 1, wherein one or more coupling prevention elements are interposed between a sidewall which is a ground surface in the chamber and an antenna adjacent to the sidewall.

8. The array antenna of claim 1, wherein the second member is a polygon, and adjacent sides of the polygon are arranged so as to face each other.

9. A plasma processing apparatus having a chamber and an array antenna that radiates an electromagnetic wave into the chamber, comprising:
    antennas; and
    coupling prevention elements arranged at intervals between the antennas,
    wherein the antennas and the coupling prevention elements are disposed in a microwave synthesis space above a dielectric window that partitions an interior of the chamber, and
    wherein each of the coupling prevention elements further comprises:
        a first member connected to a ceiling wall which is a ground surface in the chamber; and
        a second member connected to a tip end of the first member or a vicinity of the tip end of the first member.

* * * * *